United States Patent [19]

Guha et al.

[11] Patent Number: 4,891,330

[45] Date of Patent: Jan. 2, 1990

[54] METHOD OF FABRICATING N-TYPE AND P-TYPE MICROCRYSTALLINE SEMICONDUCTOR ALLOY MATERIAL INCLUDING BAND GAP WIDENING ELEMENTS

[75] Inventors: Subhendu Guha, Troy; Stanford R. Ovshinsky, Bloomfield Hills, both of Mich.

[73] Assignee: Energy Conversion Devices, Inc., Troy, Mich.

[21] Appl. No.: 174,267

[22] Filed: Mar. 28, 1988

Related U.S. Application Data

[62] Division of Ser. No. 77,722, Jul. 27, 1987, Pat. No. 4,775,425.

[51] Int. Cl.[4] .................. H01L 21/20; H01L 21/14; H01L 21/306

[52] U.S. Cl. .................. 437/81; 148/DIG. 45; 148/DIG. 122; 148/33.3; 427/38; 437/2; 437/18; 437/101; 437/233; 437/914; 437/170

[58] Field of Search .................. 148/DIG. 40, 45, 57, 148/79, 114, 169, 122, 33, 33.3; 136/249, 258; 427/38, 39, 74; 437/2, 3, 4, 18, 81, 100, 101, 233, 937, 914, 170-172

[56] References Cited

U.S. PATENT DOCUMENTS

| | | | |
|---|---|---|---|
| 4,469,715 | 9/1984 | Madan | 427/74 |
| 4,492,810 | 1/1985 | Ovshinsky et al. | 148/33 |
| 4,521,447 | 6/1985 | Ovshinsky et al. | 437/101 |
| 4,529,679 | 7/1985 | Ogawa et al. | 427/74 |
| 4,569,697 | 2/1986 | Tsu et al. | 437/101 |
| 4,619,729 | 10/1986 | Johncock et al. | 427/39 |
| 4,624,862 | 11/1986 | Yang et al. | 427/74 |
| 4,637,895 | 1/1987 | Ovshinsky et al. | 427/39 |
| 4,726,851 | 2/1988 | Matsumura et al. | 437/101 |

Primary Examiner—Brian E. Hearn
Assistant Examiner—William Bunch
Attorney, Agent, or Firm—Marvin S. Siskind; Richard M. Goldman; Kenneth M. Massaroni

[57] ABSTRACT

A method of fabricating doped microcrystalline semiconductor alloy material which includes a band gap widening element through a glow discharge deposition process by subjecting a precursor mixture which includes a diluent gas to an a.c. glow discharge in the absence of a magnetic field of sufficient strength to induce electron cyclotron resonance.

11 Claims, 1 Drawing Sheet

METHOD OF FABRICATING N-TYPE AND P-TYPE MICROCRYSTALLINE SEMICONDUCTOR ALLOY MATERIAL INCLUDING BAND GAP WIDENING ELEMENTS

GOVERNMENT RIGHTS

This invention was made with Government support under Contract No. ZB-7-060003-4 awarded by the Department of Energy. The Government has certain rights in this invention.

This application is a division of application Ser. No. 077,722 filed on July 27, 1987, now U.S. Pat. No. 4,775,425.

FIELD OF THE INVENTION

This invention relates generally to thin film semiconductor alloys and more particularly to wide band gap, n-type and p-type, microcrystalline semiconductor alloy materials, which materials incorporate at east one band gap widening element. This invention also relates to electronic and photovoltaic devices incorporating said thin film, wide band gap microcrystalline semiconductor alloy materials.

BACKGROUND OF THE INVENTION

Pursuant to the inventive concept discovered by the instant inventors, there is disclosed herein new and improved microcrystalline, wide band gap, n-type semiconductor alloy materials as well as a novel method of fabricating wide band gap n-type and p-type microcrystalline semiconductor alloy materials. It has been synergistically found by said inventors that said semiconductor alloy materials can be fabricated by a glow discharge deposition process utilizing r.f. and/or microwave energy in such a manner as to incorporate a substantial volume percentage of a band gap widening element in the host matrix thereof. Not only is that incorporation accomplished so as to obtain microcrystalline inclusions of a sufficient volume fraction that said materials are characterized by high electrical conductivity, low activation energy and a wide optical gap; but the glow discharge process does not require the presence of high magnetic fields for inducing "electron cyclotron resonance" (as discussed hereinafter).

It is well known in the plasma deposition art that microcrystalline semiconductor alloy material is difficult to fabricate and has heretofore required the use of exotic and complex deposition schemes. In the glow discharge process for the deposition of microcrystalline semiconductor alloy material, it is essential that due to the competing chemical plasma reactions which determine the growth of a film of semiconductor alloy material, vis-a-vis, the etching of that film, great care be taken in the introduction of gaseous precursors. Moreover, if the rate of film growth significantly exceeds the rate of etching, the depositing semiconductor alloy material will not possess a sufficient volume fraction of crystalline inclusions to reach a critical threshold value (as defined hereinafter); and if the rate of etching exceeds the rate of growth, no film will be deposited. It is only when the rate of deposition approximately equals the rate of etching that the required volume fraction of crystalline inclusions will be formed Further, the presence of significant atomic percentages of impurities, such as band gap widening elements, introduced into the plasma has been found to substantially inhibit the formation of crystalline inclusions and has heretofore: (1) prevented the fabrication of n-type microcrystalline semiconductor alloy material characterized by a widened optical gap and high conductivity; and (2) inhibited the fabrication of p-type microcrystalline semiconductor alloy material characterized by a widened optical gap and high conductivity without utilizing a rather complex electron cyclotron resonance technique for the glow discharge deposition thereof Due to the fact that the instant patent application deals with semiconductor alloy materials which will be referred to by specialized definitions of amorphicity and crystallinity, it is necessary to particularly set forth those specialized definitions at the outset.

The term "amorphous", as used herein, is defined by the instant inventors to include alloys or materials exhibiting long range disorder, although said alloys or materials may exhibit short or intermediate range order or even contain crystalline inclusions. As used herein the term "microcrystalline" is defined by the instant inventors to include a unique class of said amorphous materials, said class characterized by a volume fraction of crystalline inclusions, said volume fraction of inclusions being greater than a threshold value at which the onset of substantial changes in certain key parameters such as electrical conductivity, band gap and absorption constant occurs. It is to be noted that pursuant to the foregoing definitions, the microcrystalline, n-type and p-type semiconductor alloy materials of the instant invention fall within the generic term "amorphous".

The concept of microcrystalline materials exhibiting a threshold volume fraction of crystalline inclusions at which substantial charges in key parameters occur, can be best understood with reference to the percolation model of disordered materials. Percolation theory, as applied to microcrystalline disordered materials, analogizes properties such as the electrical conductivity manifested by those microcrystalline materials, to the percolation of a fluid through a non-homogeneous, semipermeable medium such as a gravel bed.

Microcrystalline materials are formed of a random network which includes low conductivity, highly disordered regions of material surrounding randomized, highly ordered crystalline inclusions having high electrical conductivity. Once these crystalline inclusions attain a critical volume fraction of the network, (which critical volume will depend, inter alia, upon the size and/or shape and/or orientation of the inclusions), it becomes a statistical probability that said inclusions are sufficiently interconnected so as to provide a low resistance current path through the random network. Therefore, at this critical or threshold volume fraction, the material exhibits a sudden increase in conductivity. This analysis (as described in general terms only relative to electrical conductivity herein) is well known to those skilled in solid state theory and may be similarly applied to describe additional physical properties of microcrystalline semiconductor alloy materials, such as optical gap, absorption constant, etc.

The onset of this critical threshold value for the substantial change in physical properties of microcrystalline materials will depend upon the size, shape and orientation of the particular crystalline inclusions, but is relatively constant for different types of materials. It should be noted that while many materials may be broadly classified as "microcrystalline", those material will not exhibit the properties that the instant inventors have found advantageous of the practice of our invention unless they have a volume fraction of crystalline inclusions which exceeds the threshold value necessary for substantial change. Accordingly, said inventors have defined "microcrystalline materials" to include only those materials which have reached the threshold value. Further note that the shape of the crystalline inclusions is critical to the volume fraction necessary to reach the threshold value. There exist 1-D, 2-D and 3-D models which predict the volume fraction of inclusions necessary to reach the threshold value, these models being dependent on the shape of the crystalline inclusions. For instance, in a 1-D model (which may be analogized to the flow of charge carriers through a thin wire), the volume fraction of inclusions in the amorphous network must be 100% to reach the threshold value. In the 2-D model (which may be viewed as substantially conically shaped inclusions extending through the thickness of the amorphous network), the volume fraction of inclusions in the amorphous network must be about 45% to reach the threshold value. And finally in the 3-D model (which may be viewed as substantially sphericaly shaped inclusions in a sea of amorphous material), the volume fraction of inclusions need only be about 16–19% to reach the threshold value. Therefore, amorphous materials (even materials classified as microcrystalline by others in the field) may include even a high volume percentage of crystalline inclusions without being microcrystalline as that term is defined herein.

Thin film semiconductor alloys have gained growing acceptance as a material from which to fabricate electronic devices such as photovoltaic cells, photoresponsive and photoconductive devices, transistors, diodes, integrated circuits, memory arrays and the like. This is because thin film semiconductor alloys (1) can be manufactured at relatively low cost, (2) possess a wide range of controllable electrical, optical and structural properties and (3) can be deposited to cover relatively large areas. Recently, considerable effort has been expended to develop systems and processes for depositing thin film semiconductor alloy materials which encompass relatively large areas and which can be doped so as to form p-type and n-type semiconductor alloy material. Among the investigated semiconductor alloy materials of the greatest significance are the silicon, germanium and silicon-germanium based alloys. Such semiconductor alloys have been the subject of a continuing development effort on the part of the assignee of the instant invention, said alloys being utilized and investigated as possible candidates from which to fabricate thin films of amorphous, microcrystalline and also polycrystalline material.

Multiple stacked cells have been employed to enhance photovoltaic device efficiency. Essentially, and pursuant to the concept of stacking cells in electrical optical series relationship, the cells are fabricated from different band gap semiconductor alloy material, each cell adapted to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

It is now possible to manufacture high quality layers of intrinsic thin film semiconductor alloy material utilizing techniques developed by the assignee of the instant invention. However, the n-type layers of thin film semiconductor alloy material heretofore fabricated have, in many instances, been of less than the optimum quality required for the manufacture of the highest efficiency electronic devices therefrom. Accordingly, and because of the limitations imposed, inter-alia, by the n-type semiconductor alloy material, the optimum operational potential of many classes of thin film semiconductor alloy devices, such as solar cells, have as yet to be achieved. The instant inventors have further found that even the p-type, wide band gap, microcrystalline semiconductor alloy material which was the subject of the patent grant in U.S. Pat. No. 4,609,771, failed to optimize the performance of photovoltaic devices incorporating said material.

For example, if a highly transparent, wide band gap, highly conductive, microcrystalline, n-type semiconductor alloy layer (also referred to as a highly "n-type layer") and a highly transparent, wide band gap, highly conductive, microcrystalline, p-type semiconductor alloy layer also referred to as a highly "p-type layer") could be fabricated, p-i-n and n-i-p type photovoltaic cells manufactured with said wide band gap microcrystalline, n-type and p-type semiconductor alloy layers would exhibit not only significant, but synergistic improvement in the operational performance thereof. Such highly n-type and p-type layers would be characterized by low activation energy and would thus increase the magnitude of the electrical field established across the layer of intrinsic semiconductor alloy material, thereby improving the fill factor of the photovoltaic cell fabricated therefrom. Similarly, the built-in potential of the photovoltaic cell, and consequently, the open circuit voltage generated thereacross would be increased by the presence of the highly conductive, very wide band gap layers of p-type and n-type microcrystalline semiconductor alloy material. Also, since the built-in potential of the cell is increased charge carriers are more readily moved from the photoactive region in which they are photogenerated to the respective electrodes despite the presence of photoinduced defects which are responsible for the well known effect of Staebler/Wronski degradation, thereby providing drastically improved stability. The improved electrical conductivity exhibited by the microcrystalline n-type semiconductor alloy material, vis-a-vis similarly constituted and doped amorphous semiconductor alloy materials, which materials are characterized by a number of crystalline inclusions below the aforementioned threshold value, would further provide for decreased series resistance encountered by charge carriers in their movement through the photovoltaic cell. The decrease in series resistance would result in an improved fill factor and an improved overall efficiency of that photovoltaic cell.

Furthermore, wide band gap layers of n-type microcrystalline semiconductor alloy material and even wider band gap layers of p-type microcrystalline semiconductor alloy material are more optically transparent than corresponding layers of amorphous semiconductor alloy material or corresponding layers of doped microcrystalline semiconductor alloy material which do not incorporate band gap widening elements. Such transparency is desirable, if not essential, not only on the light incident doped layer, but also in the junction layers of a stacked p-i-n type photovoltaic cell because increased transparency allows more light, whether incident upon the p-type layer or the n-type layer or redirected by a back reflector through those p-type and n-type layers, to pass therethrough for absorption in the layer of intrinsic semiconductor alloy material (the photogenerative region) of the lower photovoltaic cell. It is in the photoactive layers of intrinsic semiconductor alloy material that charge carrier pairs are most efficiently photogenerated and separated. Therefore, photovoltaic cells employing microcrystalline, wide band gap, n-type layers and microcrystalline wide band gap p-type layers of semiconductor alloy material would also produce higher short circuit currents due to the more efficient collection of shorter wavelength, highly energetic and blue and green light in the intrinsic material thereof and the resultant photogeneration of charge carriers therefrom. This consideration of transparency would, of course, increase in significance as the number of stacked, individual p-i-n type photovoltaic cells in a tandem device increases. This is because, in such a tandem photovoltaic device, a light absorbing (narrow band gap) n-type layer in (1) the upper photovoltaic cell would "shade" one or more of the underlying cells and thus reduce the amount of incident light absorbed in the intrinsic semiconductor alloy layer, the layer with the longest lifetime for charge carriers photogenerated therein, and (2) the lower photovoltaic cell would "shade" one or more of the superposed cells and thus reduce the amount of light redirected by a back reflector absorbed in the intrinsic semiconductor aloy layers. Obviously, with respect to the light incident p-type layer, the more the band gap can be widened without decreasing the conductivity thereof below about 1 ohm$^{-1}$ cm$^{-1}$, the less incident radiation is absorbed therein and the greater the open circuit voltage which can be generated.

No reported technique has disclosed a method of fabricating wide band gap microcrystalline n-type silicon alloy material to which have been added a substantial atomic percentage of an impurity, such as a band gap widening element. The only technique for the incorporation of a band gap widening element into a host matrix so as to fabricate wide band gap microcrystalline p-type silicon alloy materials is disclosed by Hattori, et al in a paper entitled, "High Conductive Wide Band Gap P-Type a-SiCH Prepared By ECR CVD And Its Application To High Efficiency a-Si Basis Solar Cells" presented at the 19th IEEE Photovoltaic Conference on May 4–8, 1987. As described therein, highly conductive p-type, wide optical gap, microcrystalline silicon alloy material was prepared utilizing microwave power in a chamber about which a magnetic flux is established of about 875 Gauss. The ECR (electron cyclotron resonance) plasma is extracted from the ECR excitation chamber and moved into the deposition chamber along with a gradient of dispersed magnetic field. The extracted ECR plasma interacts with the reaction gas mixture of $SiH_4$, $CH_4$ and $B_2H_6$ so as to promote the growth of a p-type a-SiCH film characterized by an optical gap of, for instance 2.25 eV and a dark conductivity of about 10 ohm$^{1-}$ cm$^{-1}$. There was no disclosure presented by Hattori, et al as to the volume fraction of crystallites or the size of those crystallites; however, it may be assumed (based upon the conductivity and band gap) that the volume fraction necessary for the aforementioned percolation theory criteria has been satisfied.

This work compares favorably with the results reported herein, wherein the resultant p-type, wide band gap silicon alloy material is characterized by an optical gap of at least 2.1 eV, a dark conductivity of about at least 1 ohm$^{-1}$ cm$^{-1}$, an activation energy of about 0.05 eV and microcrystalline inclusions amounting to at least 70 volume % in the amorphous network. Both the work of the instant inventors and the work of Hattori, at al may be utilized to fabricate the p-type layers of semiconductor alloy material in solar cells, especially the aforementioned tandem solar cell structures, as to provide synergistic increases in photoconversion efficiencies; which synergistic increases were described in commonly assigned U.S. Pat. Nos. 4,600,801 and 4,609,711. However, a very important difference between the work of the instant inventors and the work of Hattori, et al must be noted.

The difference resides in the fact that the subject inventors are able to fabricate the wide band gap, p-type (as well as n-type) microcrystalline semiconductor alloy material by a process which does not rely upon an exotic process such as the electron cyclotron resonance process of Hattori, et al in order to obtain microcrystalline inclusions in a semiconductor alloy material which contains a significant atomic percentage of a band gap widening element, such as carbon, nitrogen or oxygen. More specifically, it is well known that the fabrication of microcrystalline silicon alloy material becomes exceedingly difficult as the atomic percentage of modifiers such as carbon, nitrogen or oxygen are added thereto. (See for example, the article in the Journal of Non-Crystalline Solids 59 & 60 (1983) pp. 791–794, Hiraki, et al entitled Transformation of Microcrystalline State of Hydrogenated Silicon to Amorphous One Due to Presence of More Electronegative Impurities, which article found that as little as 2 molecular percent of $N_2$ provides for a microcrystalline silicon hydrogen film to change into an amorphous state.) It is for precisely that reason Hattori, et al was compelled to employ electron cyclotron resonance in a microwave plasma system in order to grow crystallites in an alloy which included only 10 volume percent of carbon. As a matter of fact, it must be noted that the conductivity of the film of Hattori, et al was drastically reduced as the high microwave frequency was reduced to the r.f. range.(see FIG. 8 of the Hattori, et al paper). This provides clear evidence that Hattori, et al required the presence of both a high magnetic field and a highly energetic microwave plasma in order to deposit a silicon alloy material characterized by the desired value of conductivity, optical gap and activation energy.

In mark contrast thereto, the subject inventors have significantly simplified the fabrication processes of Hattori, et al and have been able to achieve the aforementioned characteristics of high conductivity, wide optical gap and low activation energy without resorting to elaborate and expensive production techniques, such as electron cyclotron resonance. Moreover, the subject inventors have developed an r.f. glow discharge process for the deposition of such wide band gap, p-type, microcrystalline silicon alloy material, which process does not require the presence of a magnetic field at all; much less a magnetic field sufficient to induce electron cyclotron resonance. In order to stress the importance of this development, it is informative to note that there is no disclosure (other than that of Hattori, et al) of which the instant inventors are aware, in either the scientific or patent literature, of the production of wide band gap, microcrystalline silicon alloy material to which an impurity (such as a band gap widening element) has been added, whether that material is n-type or p-type. This is because the narrow regime in which to deposit microcrystalline semiconductor alloy material referred to hereinabove, which regime exists between the deposition of amorphous silicon alloy material and the etching of that material, is further reduced when significant atomic percentages of impurities, such as nitrogen, carbon or oxygen are introduced into the plasma.

Therefore, the instant inventors are the first to have developed a simple process by which to deposit n-type and p-type microcrystalline semiconductor alloy material to which band gap widening elements have been added As a matter of fact the instant inventors are the first to have developed an n-type microcrystalline wide band gap semiconductor alloy material. These and other objects and advantages of the instant invention will become apparent from a perusal of the Detailed Description Of The Invention, the Brief Description Of The Drawings and the Claims which follow.

BRIEF SUMMARY OF THE INVENTION

There is disclosed herein a wide band gap n-type microcrystalline semiconductor alloy material, said material including a band gap widening element. In accordance with a first embodiment of the invention, the semiconductor alloy material comprises a microcrystalline host matrix containing at least silicon, said host matrix having incorporated thereinto at least one band gap widening element, at least one density of states reducing element and an n-doping element. The n-dopant is preferably phosphorous, the band gap widening element is selected from the group consisting essentially of nitrogen, carbon, oxygen, and combinations thereof, and the at least one density of states reducing element is preferably hydrogen and may further include fluorine. The wide band gap, n-type, microcrystalline semiconductor alloy material is characterized by an activation energy of less than about 0.05 eV, a conductivity of greater than about 1.0 ohms$^{-1}$ cm$^{-1}$, a band gap of at least about 1.9 eV, an absorption constant for light of 5000 angstroms of approximately $3 \times 10^4$ cm$^{-1}$, and microcrystalline inclusions amounting to greater than about 70 volume % of the amorphous matrix. In other embodiments of the instant invention, the host matrix of the n-type, wide band gap, microcrystalline semiconductor alloy material may preferably comprise a silicon:germanium alloy or a germanium alloy.

There is also disclosed herein a method of fabricating a wide band gap, p-type, microcrystalline semiconductor alloy material, including a band gap widening element, through the use of an a.c. glow discharge deposition process in the absence of a magnetic field sufficient to induce electron cyclotron resonance. The method includes the steps of depositing the thin film of microcrystalline semiconductor alloy material upon a substrate through the glow discharge decomposition of a gaseous mixture of at least a semiconductor precursor gas, a p-dopant precursor gas, a band gap widening precursor gas and a diluent gas. The precursor gases includes hydrogen and may further include fluorine. In a preferred embodiment, the method further includes the step of selecting the band gap widening element from the group consisting essentially of nitrogen, carbon, oxygen, and combinations thereof.

In accordance with another preferred embodiment of the instant invention, there is provided an electronic device of the type which includes at least one set of contiguous p-type and n-type semiconductor alloy regions. The improvement in the device comprises the addition of wide band gap n-type and p-type regions of semiconductor alloy material which are fabricated of a microcrystalline semiconductor alloy material and include band gap widening elements in the host matrix thereof. In one particular embodiment of the electronic device, a plurality of sets of p-type and n-type regions sandwich a substantially intrinsic semiconductor alloy region so as to form a stacked p-i-n type tandem photovoltaic cell. The n-type and p-type microcrystaline semiconductor alloy materials are characterized by the addition of a band gap widening element so as to minimize losses due to light absorption therein without substantially compromising electrical conductivity of the materials in the tandem photovoltaic cell.

In accordance with a still further embodiment of the subject invention, there is described a single p-i-n type photovoltaic device. The p-type and n-type layers are fabricated of microcrystalline semiconductor alloy material to which band gap widening elements such as nitrogen, oxygen, or carbon are added. A back reflector which includes a highly reflective layer and a zinc oxide passivation layer is disposed between the lowermost n-type layer and the substrate. Due to the fact that the n-type and p-type layers are wide band gap and the back reflector is highly reflective, the photogenerative intrinsic layer of semiconductor alloy material, of approximately 1.65-1.8 eV band gap, may be made very thin. Also because the n-type and p-type layers create a high built-in field across the thin intrinsic layer, the photovoltaic device exhibits less than 15% Staebler/Wronski photodegradation.

Pursuant to yet a further and important embodiment of the instant invention, there is disclosed a method of fabricating p-type semiconductor alloy material which includes a band gap widening element, said method including the steps of providing a deposition chamber and vacuumizing that deposition chamber. Further included are the steps of providing a precursor mixture including a semiconductor-containing gas, a p-dopant containing gas and a band gap widening element-containing gas and subjecting that precursor mixture to an a.c. glow discharge in the absence of a magnetic field of sufficient strength to induce electron cyclotron resonance. In this manner, there is deposited a p-type microcrystalline semiconductor alloy material characterized by a band gap of greater than 2.0 eV and a conductivity of greater than 1 ohm$^{-1}$ cm$^{-1}$.

DETAILED DESCRIPTION OF THE DRAWINGS

I. The Photovoltaic Cell

Figure 1:
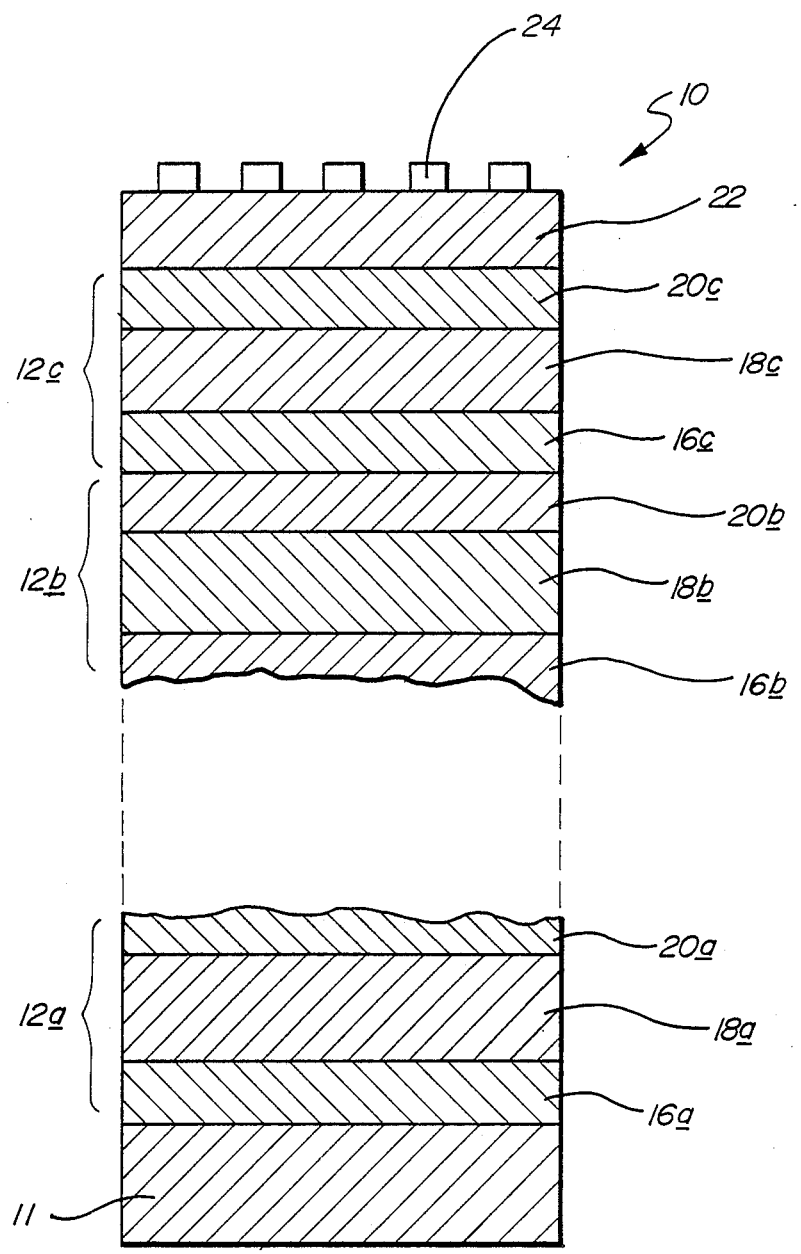
FIG. 1 is a fragmentary, cross-sectional view of a tandem photovoltaic device, said device comprising a plurality of p-i-n type cells, each layer of the cells formed from a semiconductor alloy material.

Referring now to the drawings and particularly to FIG. 1, a photovoltaic cell, formed of a plurality of successively deposited p-i-n layers, each of which includes, preferably, a thin film semiconductor alloy material, and at least one of said layers formed of the n-type or the p-type, wide band gap, microcrystalline, semiconductor alloy material of the instant invention, is shown generally by the reference numeral 10.

More particularly, FIG. 1 showns a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to applications of the amorphous material, for purposes of this application, the term "substrate" shall include not only a flexible film, but also any elements added thereto by preliminary processing. Also included within the scope of the present invention are substrates formed of glass or a glass-like material such as a synthetic polymeric resin on which an electrically conductive elect-rode is applied. A dual layered back reflector may be deposited below the lowermost doped layer, such as the n-type layer of semiconductor alloy material. In a preferred embodiment, such a dual layered back reflector will include (1) a highly reflective layer, such as gold, silver or copper deposited upon the substrate; and (2) an oxide layer, such as zinc oxide, sandwiched between said n-type layer and the highly reflective layer.

Each of the cells 12a, 12b and 12c are preferably fabricated with thin film semiconductor body containing at least a silicon alloy. Each of the semiconductor bodies includes an n-type conductivity semiconductor layer 20a, 20b or 20c; a substantially intrinsic semiconductor layer 18a, 18b or 18c; and a p-type conductivity semiconductor layer 16a, 16b or 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Also, although p-i-n photovoltaic cells are illustrated, the methods and materials of this invention may also be utilized to produce single or multiple n-i-p cells, p-n cells, Schottky barrier cells, as well as other semiconductor or devices such as diodes, memory arrays, photoconductive devices and the like.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 is adapted to shorten the carrier path and increase the conduction efficiency.

II. The Microcrystalline, N-Type Wide Band Gap Semiconductor alloy Material And Method Of Fabricating Same And Microcrystalline, P-Type Wide Band Gap Semiconductor Alloy Material The material disclosed herein is an n-type wide band gap microcrystalline semiconductor alloy fabricated from a host matrix of silicon which further includes hydrogen, with or without the addition of fluorine, as well as an n-dopant such as phosphorous or arsenic; said material further including a band gap widening element such as nitrogen, carbon or oxygen. The improved characteristics of such an n-type wide band gap microcrytalline material include an optical band gap of at least about 1.9 eV, a dark conductivity of greater than about 1 ohm$^{-1}$ cm$^{-1}$, an activation energy of less than about 0.05 eV and a sufficient volume fraction of microcrystalline inclusions in the amorphous network to establish a percolation path thereacross. The improved characteristics of such an n-type wide band gap microcrystalline material include an optical bandgap of at least about 1.9 eV, a dark conductivity of greater than about 1 ohm$^{-1}$ cm$^{-1}$, an activation energy of less than about 0.05 eV and a sufficient volume fraction of microcrystalline inclusions in the amorphous network to establish percolation paths thereacross.

The instant inventors found that said n-type wide band gap, microcrystallin semiconductor alloy material, as well as similarly constituted p-type material, may be readied fabricated by glow discharge deposition without a magnetic field capable of initiating electron cyclotron resonance, provided that the proper gaseous precursor materials are employed and proper deposition conditions are maintained. Great care must be taken in the introduction of the gaseous precursor materials because of the many competing chemical reactions which can occur in the plasma generated in a glow discharge system. Some of these reactions favor the growth or deposition of the semiconductor alloy material, while other reactions favor the etching away of that deposited semiconductor alloy material. The instant inventors have found that in order to fabricate the microcrystalline semiconductor alloy material of the instant invention, it is necessary to control said competing chemical reactions so as to control the relative rates of etching and deposition of that semiconductor alloy material. In accordance with the principles enumerated herein, if the rate of growth of the semiconductor alloy species formed in the glow discharge plasma greatly exceeds the rate of etching of the depositing materials, a semiconductor alloy film not possessing the required volume percentage of crystalline inclusions necessary to reach the threshold value will be deposited onto the substrate; and obviously, if the rate of etching of the depositing species of semiconductor alloy material exceeds the rate of deposition, no semiconductor alloy film will be deposited. It is only when the growth of the semiconductor alloy material and the etching of that material occur at approximately similar rates, that microcrystalline semiconductor alloy material with the required volume percentage of crystalline inclusions required to reach the threshold value will be deposited.

It is to be noted that the term "synergistic" may be used to describe the fabrication of the microcrystalline, wide band gap, n-type and p-type semiconductor alloy material of the instant invention. The reason for this synergism resides in the fact that the deposition plasma kinetics must further be balanced in view of the addition of substantial atomic percentages of impurities into the feedstock gases, such as the addition of the band gap widening element or elements to the precursor gases. The kinetics become very sensitive because the band gap widening element is added in significant atomic percentages and not just in dopant proportions. It is perhaps due to this plasma sensitivity that those skilled in the art were not able, prior to the subject invention, to obtain microcrystalline n-type semiconductor alloy material in which a band gap widening element was included in the host matrix thereof; and those skilled in the art were not able to obtain even p-type microcrystalline semiconductor alloy material in which a band gap widening element was included in the host matrix thereof without the presence of a strong magnetic field (such as 850 Gauss of Hattori, et al).

In a typical glow discharge deposition process for the reparation of films of semiconductor alloy material, a process gas mixture is subjected to the effects of an electromagnetic field, which electromagnetic field is developed between a cathode plate and the substrate material. A typical precursor process gas mixture employed and introduced into the plasma region in the practice of the instant invention comprises (1) a gaseous precursor including the semiconductor material which serves to provide the semiconductor element or elements of the host matrix, (2) one or more gaseous density of states reducing elements which serve to reduce undesired electronic states in the band gap of the semiconductor alloy material and thereby improve the electrical, chemical and optical properties of the resultant alloy material, (3) a band gap widening element or elements which serve to expand the width of the optical gap of the semiconductor element for, inter alia, allowing a greater percentage of incident light to pass into and be absorbed in the photogenerative region of a solar cell fabricated therefrom, and (4) a gaseous precursor n-dopant or p-dopant material which introduces the n-dopant element or the p-dopant element into the host matrix of the semiconductor alloy material; said gaseous precursor mixture may be referred to collectively herein as the reacting species. The process gas mixture also includes a gaseous diluent, which may comprise a single component or a mixture of components, and which diluent serves to dilute the reacting species so as to introduce the optimum concentration and combination of said reacting species into the glow discharge plasma. Furthermore, in some cases the diluent gas is also adapted to assist in the actual decomposition and recombination of the reacting species, and in still other cases the diluent gas is also adapted to act as a density of states reducing element.

The instant inventors have found that in the embodiment of the instant invention wherein high quality microcrystalline, n-type and p-type, wide band gap, hydrogenated semiconductor alloy material are deposited, it is necessary to employ a gaseous precursor mixture which is highly dilute; that is to say, a gaseous precursor mixture in which the reacting species of gaseous precursor material are present in relatively low concentrations relative to the diluent gas. When such a dilute gaseous precursor mixture is utilized in a glow discharge deposition process, the deposition parameters can be controlled so as to insure that the rates of etching and growth are substantially similar and that the deposition of a microcrystalline semiconductor alloy material results, despite the inclusion in the reacting species of significant atomic percentages of one or more impurities such as the band gap widening elements.

Typical process gas mixtures which can be employed in the practice of the instant invention to deposit a wide band gap, n-type or p-type, hydrogenated microcrystalline semiconductor alloy material comprise from about 0 1 to 10% of a gaseous precursor semiconductor alloy material such as silane, disilane, or silicon tetrafluoride, alone or in combination with germane; from about 0.5 to 10% of nitrogen gas or ammonia in the case of an n-dopant and methane in the case of a p-dopant; and 0.02 to 0.4% of a gaseous dopant material such as phosphine for a n-type alloy and diborane for a p-type alloy diluted in a gaseous diluent material such as hydrogen, argon or a mixture of the two. Phosphorous pentafluoride and boron trifluoride have also been used for the n and p-dopants, respectively. The ratio of phosphorous trifluoride or boron trifluoride to disilane is preferably in the range of about 40% while the ratio of diborane or phosphine to silane is preferably in the range of 4%. The typical deposition parameters which can be employed are a substrate temperature of about ambient to 250° C. (a preferred range of 175° C.–250° C.), a pressure of about 0.1–2.0 Torr, and a relatively high r.f. power density of greater than about 300 milliwatts or 1.5 watts per centimeter squared. While the foregoing paragraph utilized silane as the precursor source of silicon, disilane has also been successfully employed.

One preferred microcrystalline semiconductor alloy material of the instant invention comprises an alloy, formed of silicon:hydrogen:fluorine doped with phosphorous or boron and band gap widened with nitrogen, oxygen or carbon. Because of the fact that the semiconductor alloy material is microcrystalline, it may be readily and efficiently doped so as to achieve an extremely low activation energy, typically in the range of about 0.05 eV or less (therefore the alloy may be referred to as "degenerate" i.e., the Fermi level has been moved up to a band edge). According to the principles of the instant invention, examples of such n-type and p-type, wide band gap, highly conductive, microcrystalline, hydrogenated semiconductor alloy materials prepared by the glow discharge procedures are outlined in the following examples. Note that said procedures do not require the use of a magnetic field of sufficient strength to induce an electron cyclotron resonance. Indeed, said procedures include no externally applied magnetic field whatsoever.

EXAMPLE I (Si:N:P:H:F)

A gaseous precursor mixture comprising 0.3% silane, 0.02% phosphine, 67% hydrogen, 4.0% nitrogen gas and 28% silicon tetrafluoride was introduced into a glow discharge deposition chamber, which n-dopant chamber was maintained at a pressure of approximately 1.6 Torr. The substrate was heated to a temperature of approximately 250° C. and a radio frequency energy of 13.56 MHz at a power of 30 watts was applied to the cathode so as to initiate a glow discharge plasma therein. The wide band gap, n-type, microcrystaline semiconductor alloy film thus deposited was approximately 500 angstroms thick. Measurements made via Raman spectroscopy and transmission electron microscopy confirm that the sample was indeed microcrystalline and that the crystallite size was within the range of 60 to 100 angstroms. The volume percentage of the microcrystalline-silicon inclusions was estimated to be greater than about 70%. It is to be noted that said volume percentage is well above the percolation threshold, at which critical threshold value certain key electro-optical characteristics show marked changes. This explains the reason that the dark conductivity of the deposited microcrystalline semiconductor alloy material was so high. The thus prepared thin film of microcrystalline n-type silicon:hydrogen:fluorine:nitrogen: phosphorous alloy material had a dark conductivity of approximately 2 ohm$^{-1}$ centimeters$^{-1}$ an activation energy of less than about 0.05 eV, an optical gap of about 2.0 eV, an absorption constant at 5000 angstroms of light of about $2.5 \times 10^4$ cm$^{-1}$, and about 10% of fluorine was incorporated into the host matrix. Note that in all of the experimental deposition runs utilizing fluorine, the percentage of fluorine incorporated into the host matrix of the semiconductor alloy material was between 0.1 to 10% and typically greater than 0.1%. It is further to be noted that the absorption constant was measured at about 5000 angstroms because the inventors have discovered that previous n-type films of semiconductor alloy material, when incorporated into a tandem photovoltaic cell, would absorb too much green light. Therefore, the band gap of the n-type film was purposely widened to allow additional green radiation to pass therethrough and into the photogenerative intrinsic layer of semiconductor alloy material of the subjacent cell.

EXAMPLE II (Si:N:P:H:F)

A gaseous precursor mixture comprising 0.3% silane, 0.02% phosphine, 70% hydrogen, 0.3% ammonia gas and 28% silicon tetrafluoride was introduced into a glow discharge deposition chamber, which n-dopant chamber was maintained at a pressure of approximately 1.6 Torr. The substrate was heated to a temperature of approximately 250° C. and a radio frequency energy of 13.56 MHz at a power of 30 watts was applied to the cathode so as to initiate a glow discharge plasma therein. The wide band gap, n-type, microcrystalline semiconductor alloy film thus deposited was approximately 500 angstroms thick. Measurements made via Raman spectroscopy and transmission electron microscopy confirm that the sample was indeed microcrystalline and that the crystallite size was within the range of 60 to 100 angstroms. The volume percentage of the microcrystalline-silicon inclusions was estimated to be greater than about 70%. The thus prepared thin film of microcrystalline n-type silicon:hydrogen:fluorine:nitrogen: phosphorous alloy material had a dark conductivity of approximately 2 ohm$^{-1}$ centimeters$^{-1}$ an activation energy of less than about 0.05 eV, an optical gap of about 2.0 eV, an absorption constant at 5000 stroms of light of about $2.5 \times 10^4$ cm$^{-1}$, and about 20% of fluorine was incorporated into the host matrix. Note that in all of the experimental deposition runs utilizing fluorine, the percentage of fluorine incorporated into the host matrix of the semiconductor alloy material was between 0.1 to 10% and typically greater than 0.1%. It is further to be noted that the absorption constant was measured at about 5000 angstroms because the inventors have discovered that previous n-type films of semiconductor alloy material, when incorporated into a tandem photovoltaic cell, would absorb too much green light. Therefore, the band gap of the n-type film was purposely widened to allow additional green radiation to pass therethrough and into the photogenerative intrinsic layer of semiconductor alloy material of the subjacent cell.

EXAMPLE III (Si:N:P:H:F).

A gaseous precursor mixture comprising 0.3% silane, 0.02% phosphine, 95% hydrogen, 5% nitrogen gas was introduced into a glow discharge deposition chamber, which n-type chamber was maintained at a pressure of approximately 1.5 Torr. The substrate was heated to a temperature of approximately 250° C. and a radio frequency energy of 13.56 MHz at a power of 30 watts was applied to the cathode so as to initiate a glow discharge plasma therein. The n-type, wide band gap, microcrystalline semiconductor alloy film thus deposited was approximately 500 angstroms thick. Measurements made via Raman spectroscopy and transmission electron microscopy confirm that the sample was indeed microcrystalline and that the crystallite size was within the range of 60 to 100 angstroms. The volume percentage of the microcrystalline-silicon inclusions was estimated to be greater than about 60%. It is to be noted that said volume percentage is well above the percolation threshold, at which critical threshold value certain key electro-optical characteristics show marked changes. The thus prepared thin film of microcrystalline n-type, wide band gap, silicon:hydrogen:fluorine:nitrogen alloy material had a dark conductivity of approximately 1 ohm$^{-1}$ centimeters$^{-1}$ an activation energy of less than about 0.05 eV, an optical gap of about 2.0 eV, an absorption constant at 5000 angstroms of light of about $3 \times 10^4$ cm$^{-1}$.

EXAMPLE IV (Si:C:B:H:F)

A gaseous precursor mixture comprising 0.2% silane, 0.1% boron trifluoride, 99.5% hydrogen, 0.06% methane was introduced into a glow discharge deposition chamber, which n-dopant chamber was maintained at a pressure of approximately 1.5 Torr. The substrate was heated to a temperature of approximately 200° C. and a radio frequency energy of 13.56 MHz at a power of 30 watts was applied to the cathode so as to initiate a glow discharge plasma therein. The p-type, wide band gap microcrystalline semiconductor alloy film thus deposited was approximately 500 angstroms thick. Measurements made via Raman spectroscopy and transmission electron microscopy confirm that the sample was indeed microcrystalline and that the crystallite size was within the range of 60 to 100 angstroms. The volume percentage of the microcrystalline-silicon inclusions was estimated to be greater than about 60%. It is to be noted that said volume percentage is well above the percolation threshold, at which critical threshold value certain key electro-optical characteristics show marked changes. The thus prepared thin film of microcrystalline p-type silicon hydrogen:fluorine:carbon alloy material had a dark conductivity of approximately 1 ohm$^{-1}$ centimeters$^{-1}$ an activation energy of less than about 0.05, an optical gap of about 2.1 eV, an absorption constant at 5000 angstroms of light of about $3.10^4$ cm$^{-1}$ and about 2% of fluorine was incorporated into the host matrix.

EXAMPLE V (Si:C:B:H)

A gaseous precursor mixture comprising 0.2% silane, 0.01% diborane, 99.7% hydrogen, 0.06% methane was introduced into a glow discharge deposition chamber, which p-dopant chamber was maintained at a pressure of approximately 1.5 Torr. The substrate was heated to a temperature of approximately 185° C. and a radio frequency energy of 13.56 MHz at a power of 30 watts was applied to the cathode so as to initiate a glow discharge plasma therein The p-type, wide band gap, microcrystalline semiconductor alloy film thus deposited was approximately 500 angstroms thick. Measurements made via Raman spectroscopy and transmission electron microscopy confirm that the sample was indeed microcrystalline and that the crystallite size was within the range of 50 to 100 angstroms. The volume percentage of the microcrystalline-silicon inclusions was estimated to be greater than about 60%. It is to be noted that said volume percentage is well above the percolation threshold, at which critical threshold value certain key electro-optical characteristics show marked changes. The thus prepared thin film of microcrystalline p-type wide band gap silicon:hydrogen:carbon:boron alloy material had a dark conductivity of approximately 1.0 ohm$^{-1}$ centimeters$^{-1}$ an activation energy of less than about 0.05 eV, an optical gap of about 2.1 eV, an absorption constant at 5000 angstroms of light of about $3.10^4$ cm$^{-1}$. It is interesting to note that the plot of (absorption constant x photon energy) to the ½ power against photon energy, from which one determines the optical gap, shows a steeper slope for the p-type material than in the n-type material

EXAMPLE VI (Si:C:B:H:F)

A gaseous precursor mixture comprising 0.2% silane, 0.01% BF$_3$, 99.6% hydrogen, 0.06% methane was introduced into a glow discharge deposition chamber, which p-dopant chamber was maintained at a pressure of approximately 1.5 Torr. The substrate was heated to a temperature of approximately 185° C. and a radio frequency energy of 13.56 MHz at a power of 30 watts was applied to the cathode so as to initiate a glow discharge plasma therein. The p-type, wide band gap, microcrystalline semiconductor alloy film thus deposited was approximately 500 angstroms thick. Measurements made via Raman spectroscopy and transmission electron microscopy confirm that the sample was indeed microcrystalline and that the crystallite size was within the range of 50 to 100 angstroms. The volume percentage of the microcrystalline-silicon inclusions was estimated to be greater than about 60%. It is to be noted that said volume percentage is well above the percolation threshold, at which critical threshold value certain key electro-optical characteristics show marked changes. The thus prepared thin film of microcrystalline p-type, wide band gap silicon:hydrogen:carbon:boron:fluorine alloy material had a dark conductivity of approximately 1.0 ohm$^{-1}$ centimeters$^{-1}$ an activation energy of less than about 0.05 eV, an optical gap of about 2.1 eV, an absorption constant at 5000 angstroms of light of about $3.10^4$ cm$^{-1}$.

In summary then, the n-type and p-type wide band gap, microcrystalline semiconductor alloy material of the instant invention exhibits high electrical conductivity and may therefore be efficiently doped to provide low activation energies and substantially degenerate behavior. Because of that high conductivity, the ease with which the microcrystalline material can establish ohmic contact to a wide variety of the semiconductor alloy materials, and the fact that the n-type and p-type microcrystalline materials can be fabricated in a process which is compatible with the process for fabricating the other layers of amorphous semiconductor alloy material, the microcrystalline semiconductor alloy material of the instant invention (to which band gap widening elements have been added) may be advantageously employed to form contacts, circuit lines, bus bars and other types of conductive members employed in the manufacture of integrated circuits.

In recapitulation, not only have the instant inventors for the first type been able to deposit n-type wide band gap, microcrystalline semiconductor alloy materials, but the instant inventors have also developed a method of depositing said n-type material as well as correspondingly configured p-type wide band gap, microcrystalline semiconductor alloy materials in an r.f. or microwave glow discharge deposition process which does not require the presence of a magnetic field capable of inducing electron cyclotron resonance.

The foregoing description is merely meant to be illustrative of the instant invention, and not as a limitation upon the practice thereof. Numerous variations and modifications of the disclosed embodiments of the instant invention are possible. It is the following claims, including all equivalents, which define the scope of the instant invention.

We claim:

1. A method of fabricating doped microcrystalline semiconductor alloy material which includes a band gap widening element, said method including the steps of:
   providing a deposition chamber;
   providing a substrate in said deposition chamber;
   vacuumizing said deposition chamber;
   providing a precursor mixture including a semiconductor-containing gas, a dopant-containing gas and a band gap widening element-containing gas; said mixture further including a diluent gas;
   coupling a source of a.c. energy into the interior of the deposition chamber;
   subjecting said precursor mixture to an a.c. glow discharge in the absence of a magnetic field of sufficient strength to induce electron cyclotron resonance, said magnetic field not caused solely by said a.c. initiated glow discharge; and
   depositing doped microcrystalline semiconductor alloy material, said material formed by a random network of relatively low conductvity, disordered regions surrounding highly ordered crystalline inclusions, said volume fraction of crystalline inclusions being sufficient to provide a relatively low resistance current path through the random network, whereby the material exhibits dark electrical conductivity of at least 0.5 ohm$^{-1}$ cm$^{-1}$ and a band gap of at least 1.9 eV.

2. A method as in claim 1, including the further step of providing a silicon precursor in the semiconductor-containing gas.

3. A method as in claim 2, including the further step of providing a boron precursor in the dopant-containing gas.

4. A method as in claim 2, including the further step of providing a phosphorus precursor in the dopant-containing gas.

5. A method as in claim 2, further including the step of providing hydrogen as the diluent gas.

6. A method as in claim 5, further including the step of providing at least about 67% hydrogen gas in the precursor mixture.

7. A method as in claim 1, further including the step of including at least one density of states reducing element in the precursor mixture.

8. A method as in claim 7, wherein fluorine and hydrogen are incorporated as density of states reducing elements.

9. A method as in claim 1, further including the step of selecting said band gap widening element from the group consisting essentially of nitrogen, carbon, oxygen, and combinations thereof.

10. A method as in claim 9, wherein the dopant containing gas includes boron and the widening element includes carbon.

11. A method as in claim 9, wherein the dopant containing gas includes phosphorus and the widening element includes nitrogen.

* * * * *